United States Patent
Lee (10) Patent No.: US 7,733,400 B2
(45) Date of Patent: Jun. 8, 2010

(54) OPTICAL IMAGE RECEIVING DEVICE HAVING WIDE DYNAMIC RANGE

(75) Inventor: Do Young Lee, Kyeungki-do (KR)

(73) Assignee: Siliconfile Technologies, Inc., Seoul (KR)

( * ) Notice: Subject to any disclaimer, the term of this patent is extended or adjusted under 35 U.S.C. 154(b) by 1022 days.

(21) Appl. No.: 10/544,774

(22) PCT Filed: Feb. 7, 2004

(86) PCT No.: PCT/KR2004/000237

§ 371 (c)(1),
(2), (4) Date: Aug. 5, 2005

(87) PCT Pub. No.: WO2004/071079

PCT Pub. Date: Aug. 19, 2004

(65) Prior Publication Data

US 2006/0181626 A1   Aug. 17, 2006

(30) Foreign Application Priority Data

Feb. 7, 2003   (KR) .................. 10-2003-0007743

(51) Int. Cl.
*H04N 3/14* (2006.01)
*H04N 9/73* (2006.01)
*H01L 27/00* (2006.01)

(52) U.S. Cl. ............... 348/308; 348/223.1; 348/294; 250/208.1; 257/291

(58) Field of Classification Search ............ 250/208.1; 348/308, 223.1, 208.1, 294; 257/291–292
See application file for complete search history.

(56) References Cited

U.S. PATENT DOCUMENTS 5,742,058 A * 4/1998 Pantigny et al. ........ 250/370.08

(Continued)

FOREIGN PATENT DOCUMENTS

JP   2000-201300   7/2000

(Continued)

OTHER PUBLICATIONS

PCT International Search Report; PCT/KR2004/000237; Dated: Feb. 7, 2003.

(Continued)

*Primary Examiner*—Nhan T Tran
*Assistant Examiner*—Mekonnen Dagnew
(74) *Attorney, Agent, or Firm*—Jae Y. Park; Kile Goekjian Reed & McManus (57) ABSTRACT

Provided is an optical image receiving device having a high and rapid sensitivity and a wide dynamic range manufacture in a CMOS process. The image receiving device includes a capacitor transistor for a special purpose in addition to a general structure of three transistors and a light receiving portion. The capacitor transistor has first and second source/drain ports connected to the capacitance node and the floating diffusion node, respectively, and is gated in response to activation of a predetermined capacitor control signal. In the CMOS optical image receiving device, the floating diffusion node is pumped over an external power voltage. Thus, the electronic potential of the floating diffusion node in the initialization state is much higher than the maximum voltage of the light receiving portion. Thus, the CMOS active pixel has a very high sensitivity in a region where the intensity of light is weak. Furthermore, since the sensitivity decreases in a region where the intensity of light is strong, the dynamic range thereof can be increased very large.

4 Claims, 9 Drawing Sheets

U.S. PATENT DOCUMENTS

| | | | | |
|---|---|---|---|---|
| 6,008,486 | A | 12/1999 | Stam et al. | 250/208.1 |
| 6,300,613 | B1 | 10/2001 | Kuderer | 250/208.2 |
| 6,512,544 | B1* | 1/2003 | Merrill et al. | 348/302 |
| 7,015,964 | B1 | 3/2006 | Koizumi et al. | |
| 7,443,427 | B2* | 10/2008 | Takayanagi | 348/223.1 |
| 2004/0036784 | A1* | 2/2004 | Bock | 348/308 |
| 2004/0130757 | A1 | 7/2004 | Mabuchi et al. | |
| 2004/0196398 | A1* | 10/2004 | Doering et al. | 348/308 |

FOREIGN PATENT DOCUMENTS

| | | |
|---|---|---|
| JP | 2001-257943 | 9/2001 |
| JP | 2004-140149 | 5/2004 |

OTHER PUBLICATIONS

Written Opinion of the International Searching Authority of Corresponding PCT Application: PCT/KR/2004/000237; Dated: Jun. 12, 2004.

* cited by examiner

OPTICAL IMAGE RECEIVING DEVICE HAVING WIDE DYNAMIC RANGE

TECHNICAL FIELD

The present invention relates to an image sensor, and more particularly, to the structure of a pixel of a CMOS (complementary metal oxide semiconductor) image sensor

BACKGROUND ART

An image sensor captures an image by using a semiconductor device's feature of reacting to external energy, for example, photons. Light generated from an object existing in nature has an intrinsic energy value in a wavelength thereof. A pixel of the image sensor detects the light generated from the object and converts the detected light to an electric value.

A photodiode included in the pixel of the image sensor typically has a P-I-N (P-type semiconductor-intrinsic semiconductor-N-type semiconductor) structure to maximize a quantum efficiency. The advantage of the P-I-N structure lies in that a wide depletion region can be formed by injecting impurity having a concentration lower than other N-type region. A strong electric field can be generated in the depletion region. Thus, the pairs of electrons and holes generated by photons incident on the depletion region are not recombined but separated from one another. That is, since the electrons enter in the photodiode while the holes are exhausted out of the photodiode, the electrons are completely captured. However, a weak electric field is generated in a balance region, other than the depletion region. Thus, since the electron and hole pairs generated by the photons incident on the balance region are highly likely to recombine, a possibility of capturing the electrons, that is, the quantum efficiency, is remarkably lowered. As a result, to improve the quantum efficiency, it is advantageous to increase the size of the depletion region as well as the size of the photodiode.

Figure 1:
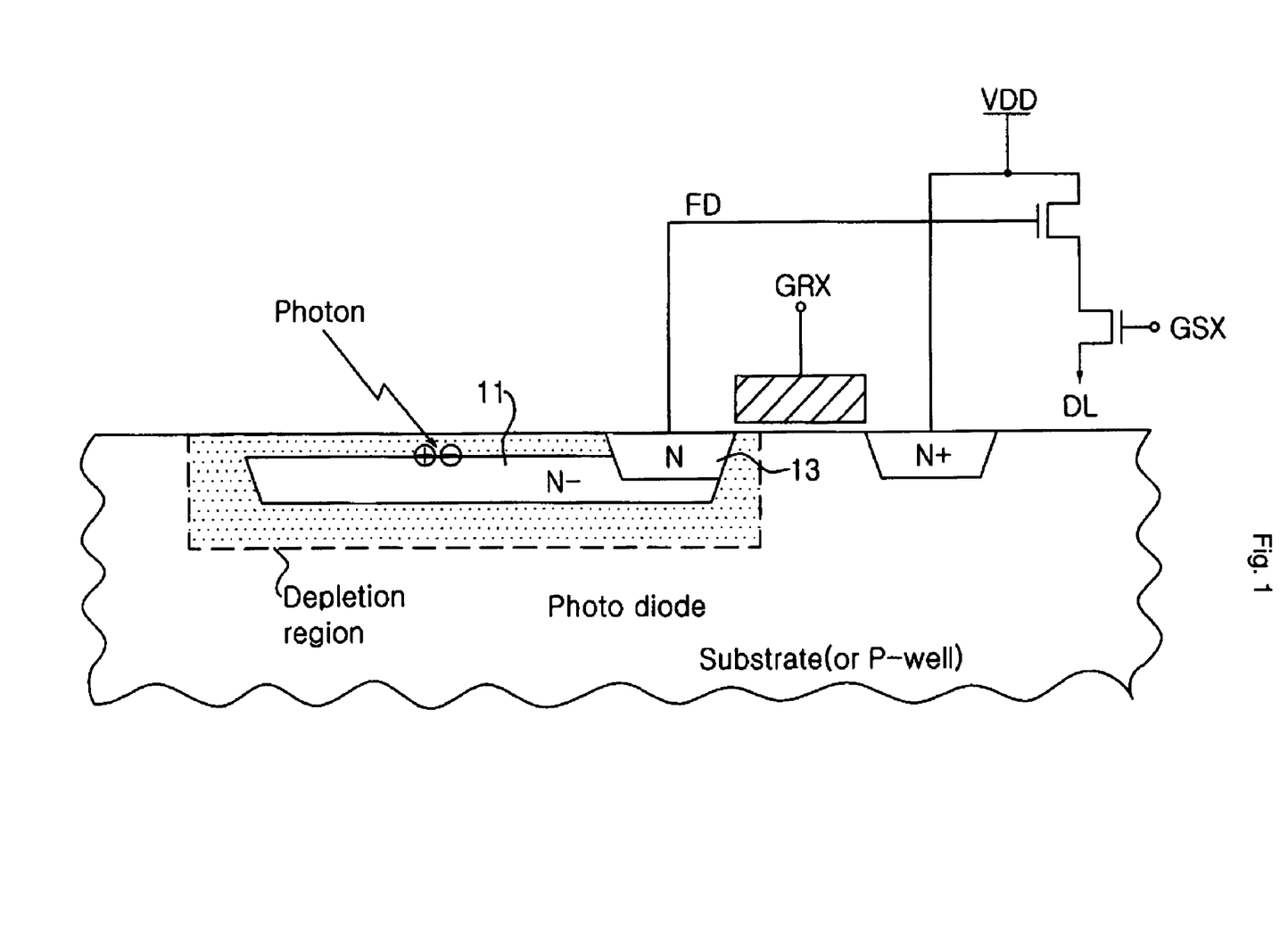
FIG. 1 is a view illustrating a conventional 3-transistor CMOS active pixel, in which the section of a photodiode is shown with electronic signs of other elements.

FIG. 1 shows a conventional 3-transistor CMOS active pixel, in which the section of a photodiode is shown with electronic signs of other elements. In the conventional 3-transistor CMOS active pixel, an N⁻ type impurity layer 11 constituting one side conjunction of the photodiode contacts an N type floating diffusive layer 13. That is, since the floating diffusive layer 13 functions as a capacitor of the photodiode, an actual capacitance component of the photodiode is a sun of capacitor components generated by the N$^?$ type impurity layer 11 and the N type floating diffusive layer 13. Thus, the sensitivity of the image sensor employing the conventional 3-transistor CMOS active pixel is deteriorated.

Also, as the N type impurity of the floating diffusive layer 13 enters the N$^?$ type impurity layer 11, the size of the depletion region decreases. Thus, even if an externally input voltage is increased, a critical voltage, that is, a pining voltage VPIN, at which the depletion region is not formed any more, can be lower than an external power voltage VDD. In this case, however, the operating range of the CMOS active pixel decreases.

DISCLOSURE OF INVENTION

Technical Problem

To solve the above and/or other problems, the present invention provides a CMOS active pixel that enables the operation of an image sensor even in a low voltage range and improves the sensitivity thereof.

Technical Solution

According to an aspect of the present invention, a CMOS active pixel comprises a photodiode which generates signal charges according to received photons, a capacitance node which receives the signal charges generated from the photodiode, a reset transistor which resets the capacitance node in response to activation of a predetermined reset control signal, a floating diffusion node which gates a predetermine driving transistor, the driving transistor which is controlled by a voltage level of the floating diffusion node, a select transistor which transmits a voltage transmitted by the driving transistor to a corresponding data line in response to a predetermined row selection signal, and a capacitor transistor which has first and second source/drain ports connected to the capacitance node and the floating diffusion node, respectively, and is gated in response to activation of a predetermined capacitor control signal.

The capacitor control signal is inactivated before the reset control signal is inactivated and activated after the inactivation of the reset control signal.

According to another aspect of the present invention, a CMOS active pixel is provided. The structure of the CMOS active pixel is substantially the same as that of the above preferred embodiment. However, a capacitor is provided instead of the capacitor transistor and has one port commonly connected to the capacitance node and the floating diffusion node and the other port electrically connected to a predetermined capacitor control signal.

ADVANTAGEOUS EFFECTS

As described above, in the CMOS active pixel according to the present invention, the floating diffusion node driving the driving transistor is pumped over the external power voltage. Thus, the electronic potential of the floating diffusion node in the initialization state is quite greater than the pinning voltage of the photodiode. Thus, the CMOS active pixel according to the present invention has a very high sensitivity in a region where the intensity of light is weak. Furthermore, since the sensitivity decreases in a region where the intensity of light is strong, the dynamic range thereof can be increased very large.

DESCRIPTION OF DRAWINGS

The above and other features and advantages of the present invention will become more apparent by describing in detail preferred embodiments thereof with reference to the attached drawings in which.

MODE FOR INVENTION

Figure 2:
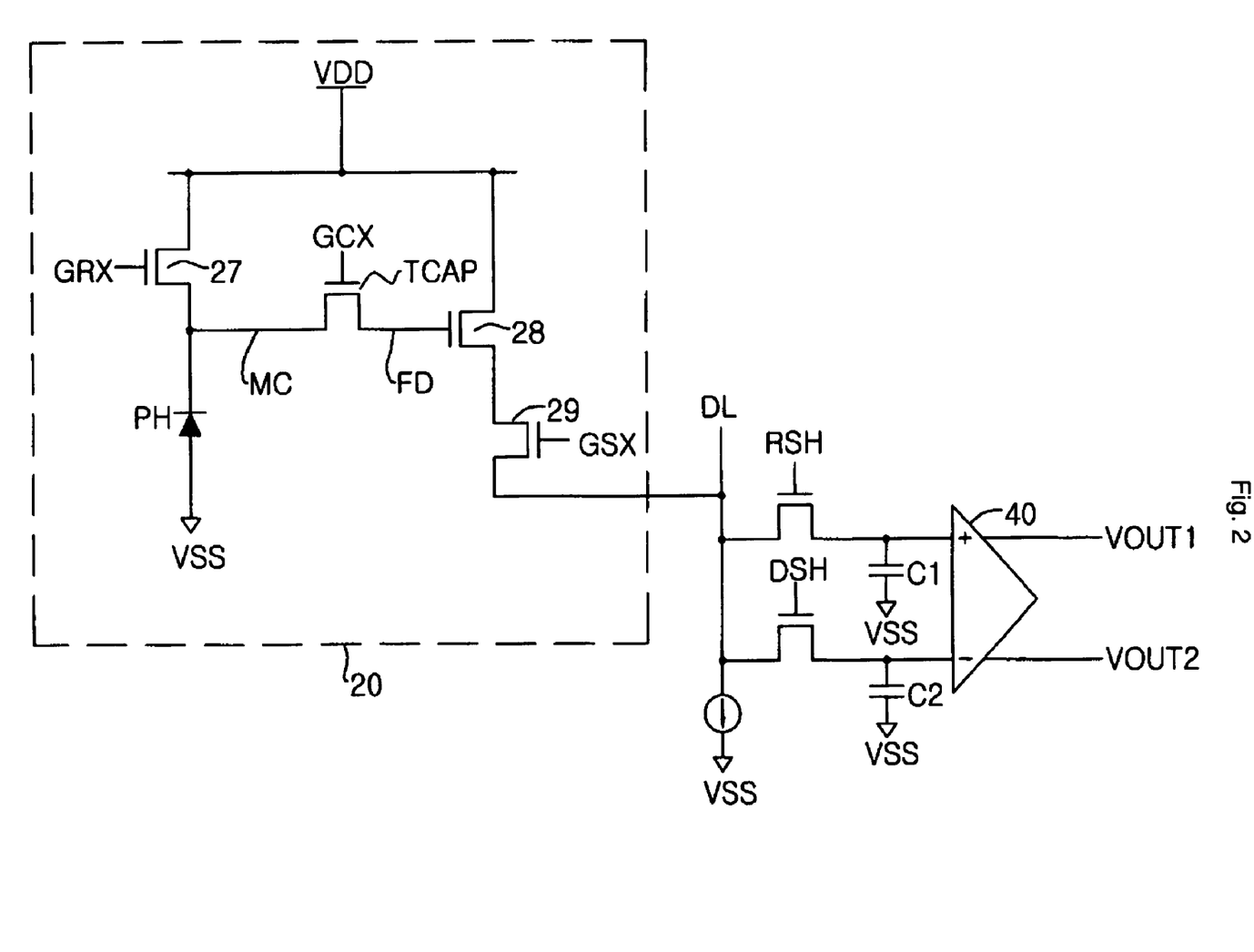
FIG. 2 is a circuit diagram showing an image sensor using a CMOS active pixel according to a preferred embodiment of the present invention.

Referring to FIG. 2, a CMOS active pixel 20 according to a preferred embodiment of the present invention includes a photodiode PH, a capacitance node MC, a reset transistor 27, a floating diffusion node FD, a driving transistor 28, a select transistor 29, and a capacitor transistor TCAP.

The photodiode PH generates signal charges according to received photons. Preferably, the photodiode PH has a P-I-N structure, that is, an intrinsic semiconductor layer is formed at a boundary of a PN junction by forming an impurity layer by injecting N-type impurity formed in a P-well or P-type substrate. Since the photodiode PH having a P-I-N structure forms a PN junction at both lower and upper boundary surfaces of the N-type impurity layer, a quantum efficiency is improved.

The capacitance node MC receives the signal charges generated by the photodiode PH. The reset transistor 27 is gated by a predetermined reset control signal GRX. When the reset control signal GRX is 'high' so as to be activated, charges remaining at the capacitance node MC are output to an external power voltage VDD. Thus, when the reset control signal GRX is activated, potential energy in the photodiode PH region becomes a ground state and initialized.

The driving transistor 28 is gated by the floating diffusion node FD. That is, the driving transistor 28 is controlled by a voltage level of the floating diffusion node FD. At last, a voltage level transmitted to a data line DL is determined.

The select transistor 29 transmits a voltage transmitted by the driving transistor 28 to the data line DL corresponding to a column of the CMOS active pixel 20 in response to a predetermined row selection signal GSX. The row selection signal GSX is a signal to select a row including the CMOS active pixel 20. When the row selection signal GSX is activated, data of all CMOS active pixels in the same row are transmitted to the data line DL.

A reset voltage and a data voltage are sampled from the voltage of the data line DL in response to a reset sampling signal RSH and a data sampling signal DSH and stored in a first capacitor C1 and a second capacitor C2, respectively. The stored reset voltage and data voltage are compared to a comparator 40 and a first output signal VOUT1 and a second output signal VOUT2 are generated.

The CMOS active pixel 20 according to a preferred embodiment of the present invention further includes the capacitor transistor TCAP. Preferably, the capacitor transistor TCAP has first and second source/drain ports connected to the capacitance node MC and the floating diffusion node FD, respectively, and is an NMOS transistor that is gated by a predetermined capacitor control signal GCX. Thus, when the capacitor control signal GCX is 'high' so as to be activated, the capacitor transistor TCAP is turned on so as to form a capacitor.

Figure 3:
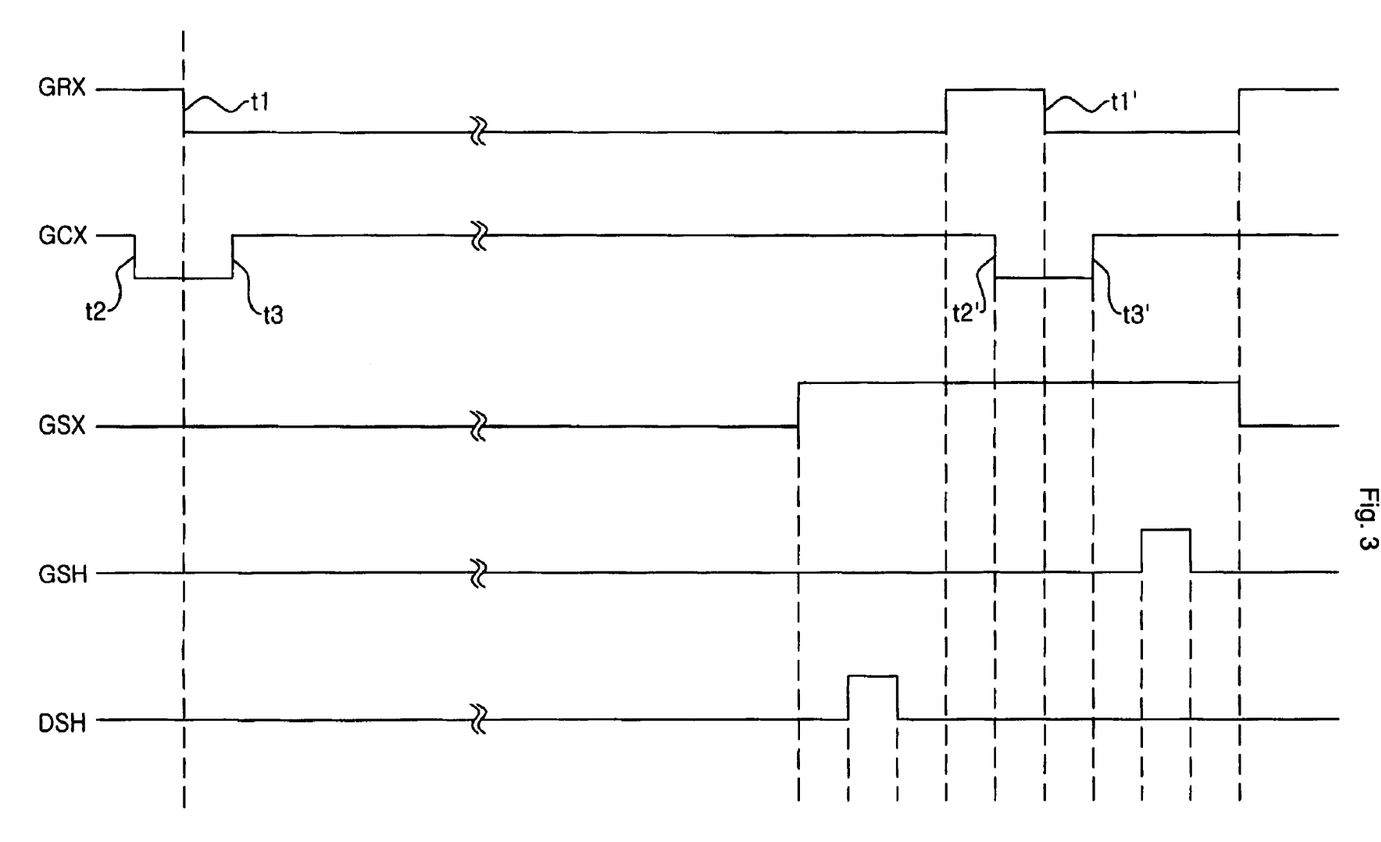
FIG. 3 is a timing diagram of signals related to the preferred embodiment of FIG. 2.

FIG. 3 is a timing diagram of signals related to the preferred embodiment of FIG. 2. As shown in FIG. 3, the capacitor control signal GCX is inactivated around inactivation points t1 and t1 ? of the reset control signal GRX. That is, the capacitor control signal GCX is inactivated to 'low' at points t2 and t2 ? before the inactivation of the reset control signal GRX and activated to 'high' at points t3 and t3 ? after the inactivation of the reset control signal GRX. According to the timing of the capacitor control signal GCX, a capacitor component formed by the capacitor transistor TCAP can increase a voltage of the floating diffusion node FD over the external power voltage VDD. As a result, as shown in FIG. 4, the electronic potential of the floating diffusion node FD is higher by h1 than that of a region where the external power voltage VDD is applied, which appears in the drawing to be lower because the electronic potential has a unit of −eV.

Figure 4:
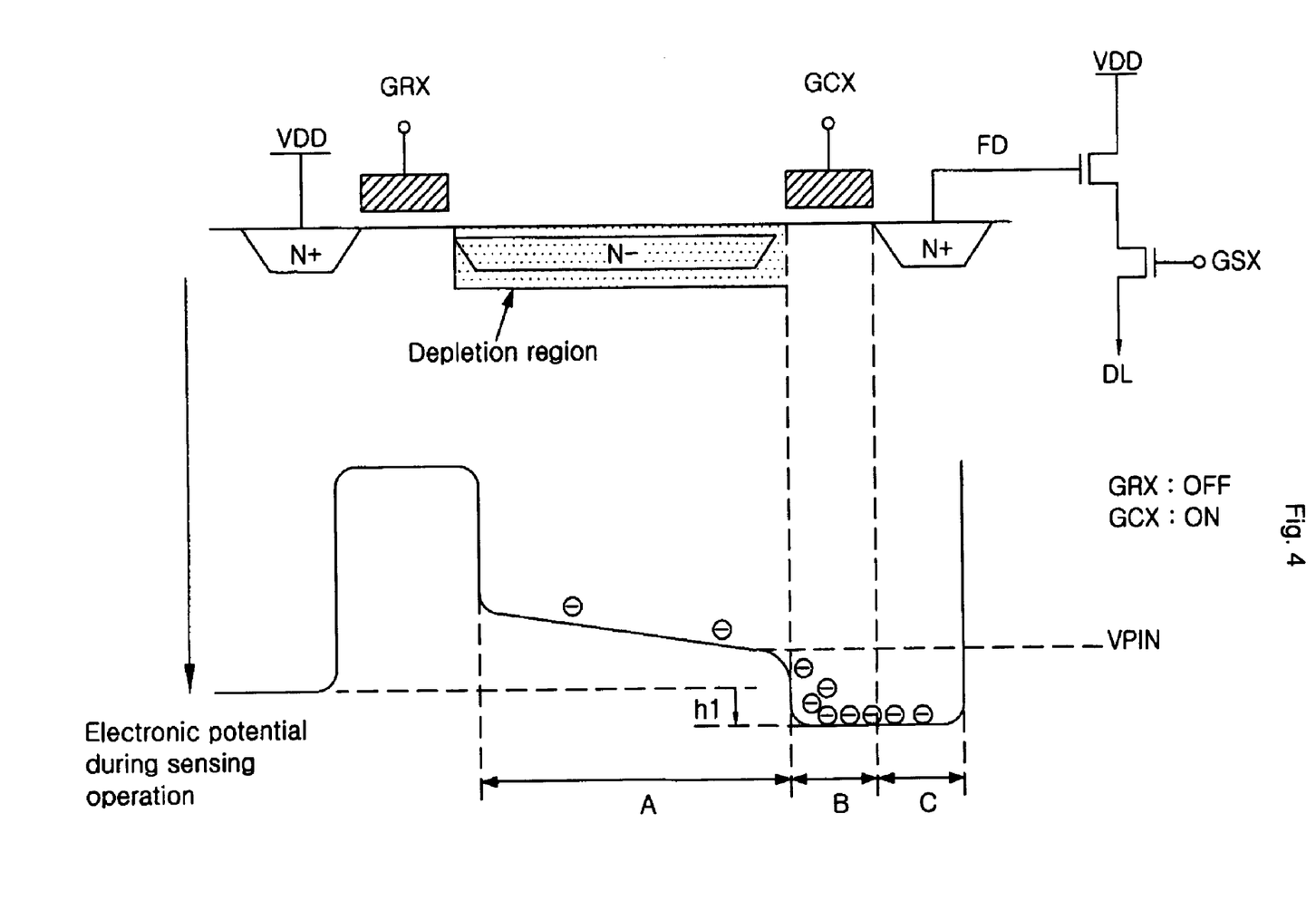
FIG. 4 is a view illustrating the section of the CMOS active pixel shown in FIG. 2, in which the section of a photodiode and electronic potentials with respect to the respective regions are shown with electronic signs of other elements.

As shown in FIG. 4, the electronic potentials of a capacitor transistor region B and a floating diffusion node region C in an initialization state are higher than that of a photodiode region A. Accordingly, signal charges generated from the photodiode region A are moved to both regions B and C. Thus, even when electrons are captured in the photodiode region A, the electronic potential of the photodiode region A is not lowered. That is, a depletion region in the photodiode region A does not increase. Thus, the sensitivity of a CMOS active pixel is very high at a low voltage. Such a phenomenon continues until the electronic potentials of the capacitor transistor region B and the floating diffusion node region C are the same as that of the photodiode region A.

After the electronic potentials of the capacitor transistor region B and the floating diffusion node region C are the same as that of the photodiode region A, since not only the capacitor transistor region B and the floating diffusion node region C but also the photodiode region A substantially functions as a capacitor, the sensitivity decreases and the dynamic range increases.

Figure 5:
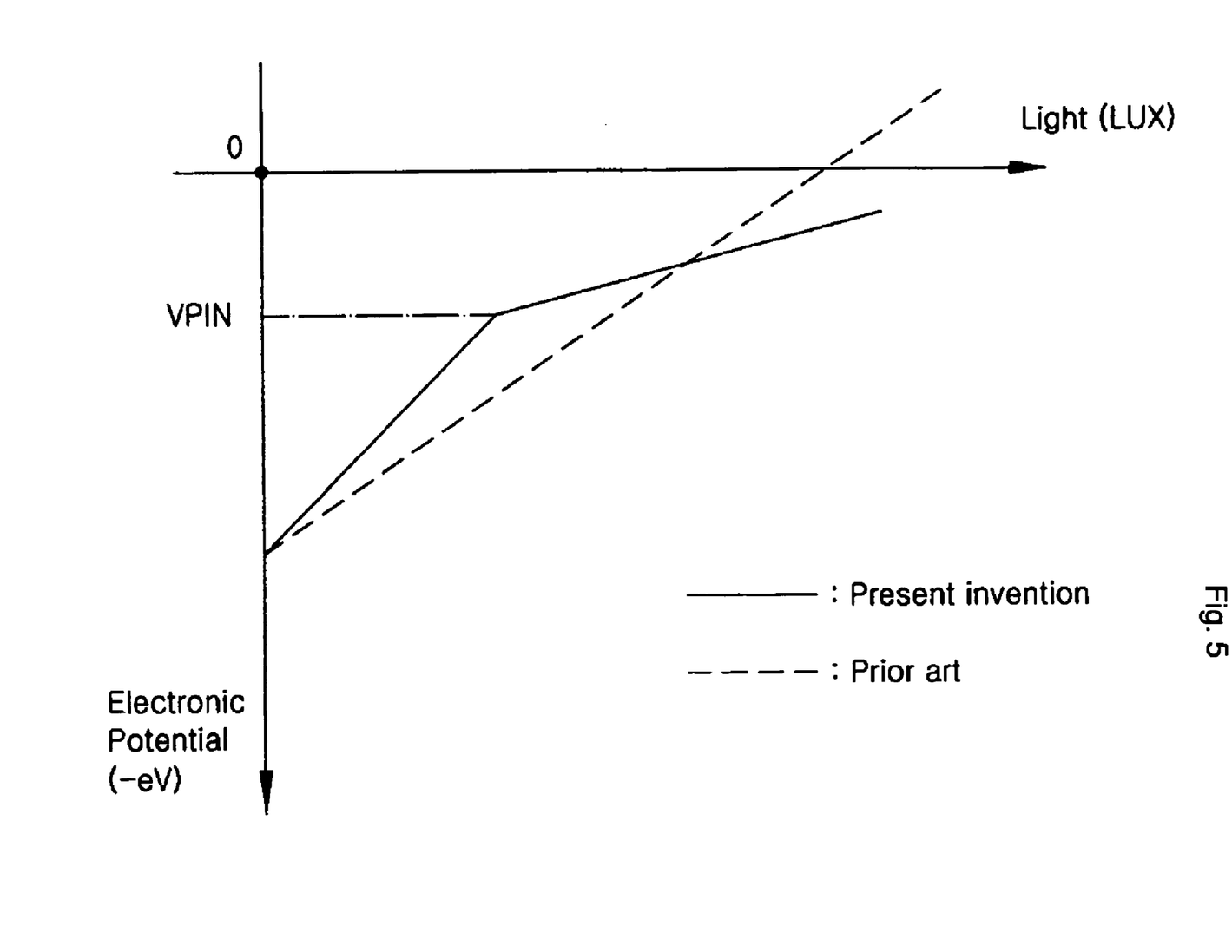
FIG. 5 is a plot showing the effect of the CMOS active pixel according to a preferred embodiment of the present invention in comparison with the conventional CMOS active pixel.

FIG. 5 is a plot showing the effect of the CMOS active pixel according to a preferred embodiment of the present invention in comparison with the conventional CMOS active pixel. In FIG. 5, the horizontal axis signifies light incident on the photodiode PH, that is, the amount of photons, while the vertical axis signifies the electronic potential of the floating diffusion node region B of FIG. 4. Also, a solid line signifies the electronic potential of the present invention while a dotted line signifies the electronic potential of the convention technology. Referring to FIG. 5, the inclination of the electronic potential in the present invention with respect to light energy until the electronic potential of the floating diffusion node region B becomes a pinning voltage VPIN is steeper than that of the conventional technology. However, the inclination of the electronic potential in the present invention with respect to light energy after the electronic potential of the floating diffusion node region B becomes the pinning voltage VPIN is gentler than that of the conventional technology.

Thus, the CMOS active pixel according to the present invention reacts with a very high sensitivity in a region where the intensity of light is weak and has a very wide dynamic range since the sensitivity decreases in a region where the intensity of light is strong.

Figure 6:
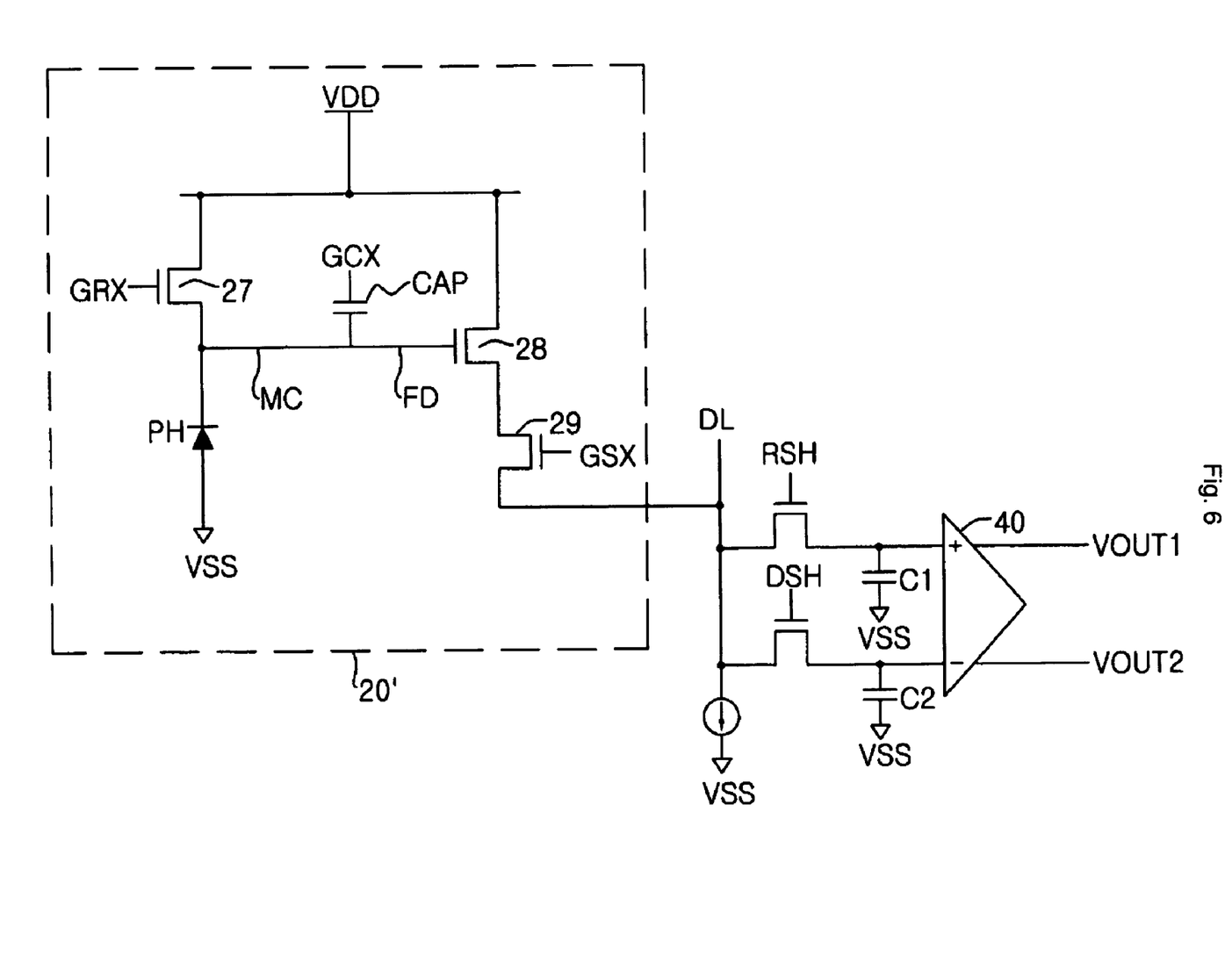
FIG. 6 is a circuit diagram of a modification of the CMOS active pixel of FIG. 2.

FIG. 6 shows a modified example of the CMOS active pixel of FIG. 2. The structure of the modified example of FIG. 6 is substantially the same as that of the preferred embodiment shown in FIG. 2. However, a capacitor CAP is provided instead of the capacitor transistor TCAP of FIG. 2. One port of the capacitor CAP is commonly connected to the capacitance node MC and the floating diffusion node FD. The other port of the capacitor CAP is connected to the capacitor control signal GCX.

The timing diagram of the modified example of FIG. 6 is the same as that of FIG. 3. The effect of the modified example of FIG. 6 is almost the same as that of the preferred embodiment of FIG. 2. Thus, detailed descriptions on the timing and effect of the relevant signals of FIG. 6 are omitted herein.

Figure 7:
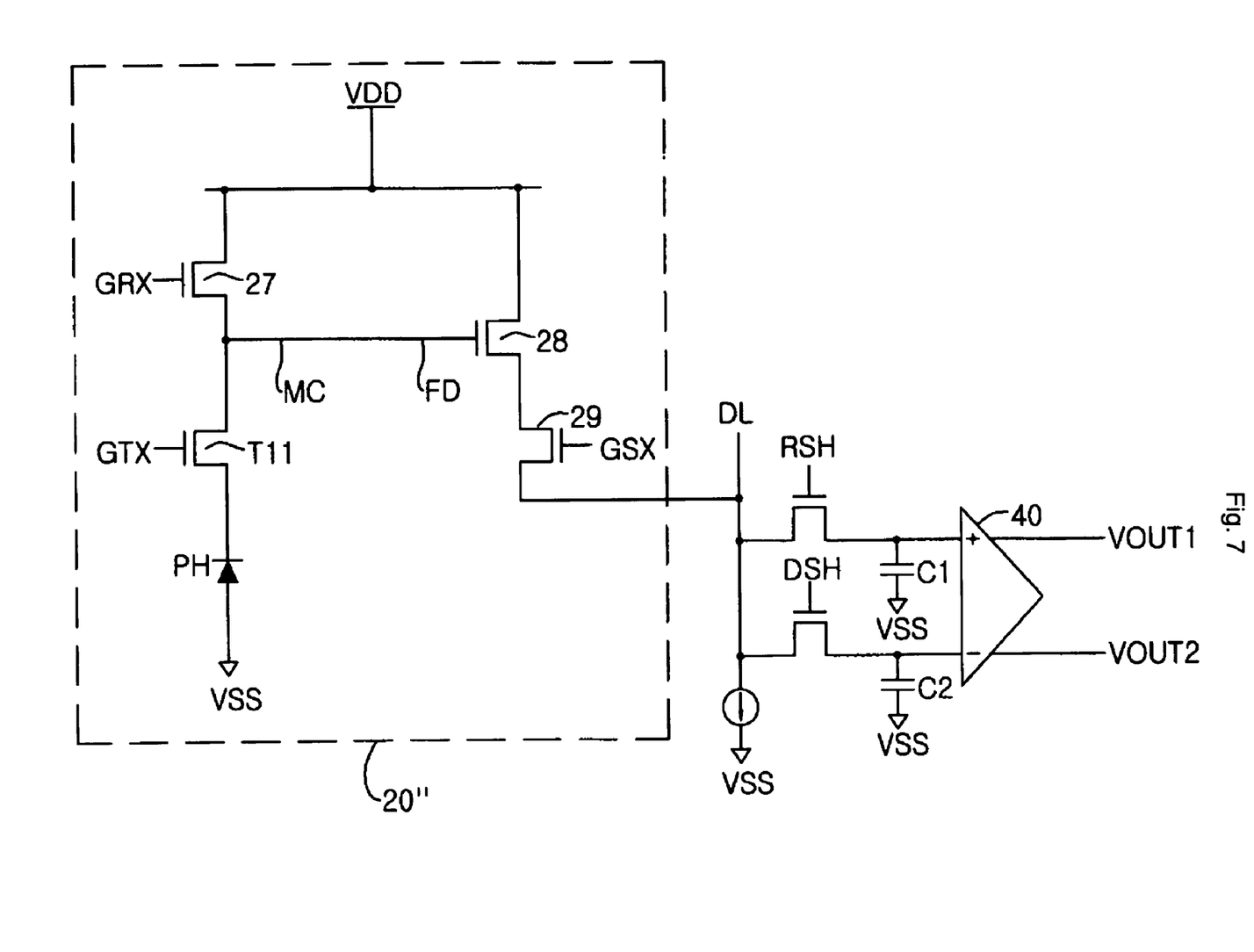
FIG. 7 is a circuit diagram of a 4-transistor CMOS active pixel according to another preferred embodiment of the present invention.

The characteristic feature of the CMOS active pixel of the present invention can be applied to a 4-transistor CMOS active pixel. FIG. 7 is a circuit diagram of a 4-transistor CMOS active pixel according to another preferred embodiment of the present invention. The structure of the 4-transistor CMOS active pixel of FIG. 7 is almost the same as that of the conventional 4-transistor CMOS active pixel.

For the convenience of explanation, only the different structural features between the present preferred embodiment of FIG. 7 and the preferred embodiment of FIG. 3 are described. In the present preferred embodiment of FIG. 7, the floating diffusion node FD is electrically connected to the capacitance node MC. Accordingly, the floating diffusion node FD and the capacitance node MC are the same node. A predetermined transmission transistor T11 is provided between the photodiode PH and the capacitance node MC. This is a characteristic feature of the 4-transistor CMOS active pixel which prevents contact between the photodiode PH and the floating diffusion node FD.

The transmission transistor T11 is gated by a predetermined transmission control signal GTX. Thus, when the transmission control signal GTX is activated to 'high', the photodiode PH is connected to the capacitance node MC.

The timing diagram of the relevant signals in the preferred embodiment of FIG. 7 is different from that of the relevant signals of the conventional 4-transistor CMOS active pixel.

Figure 8:
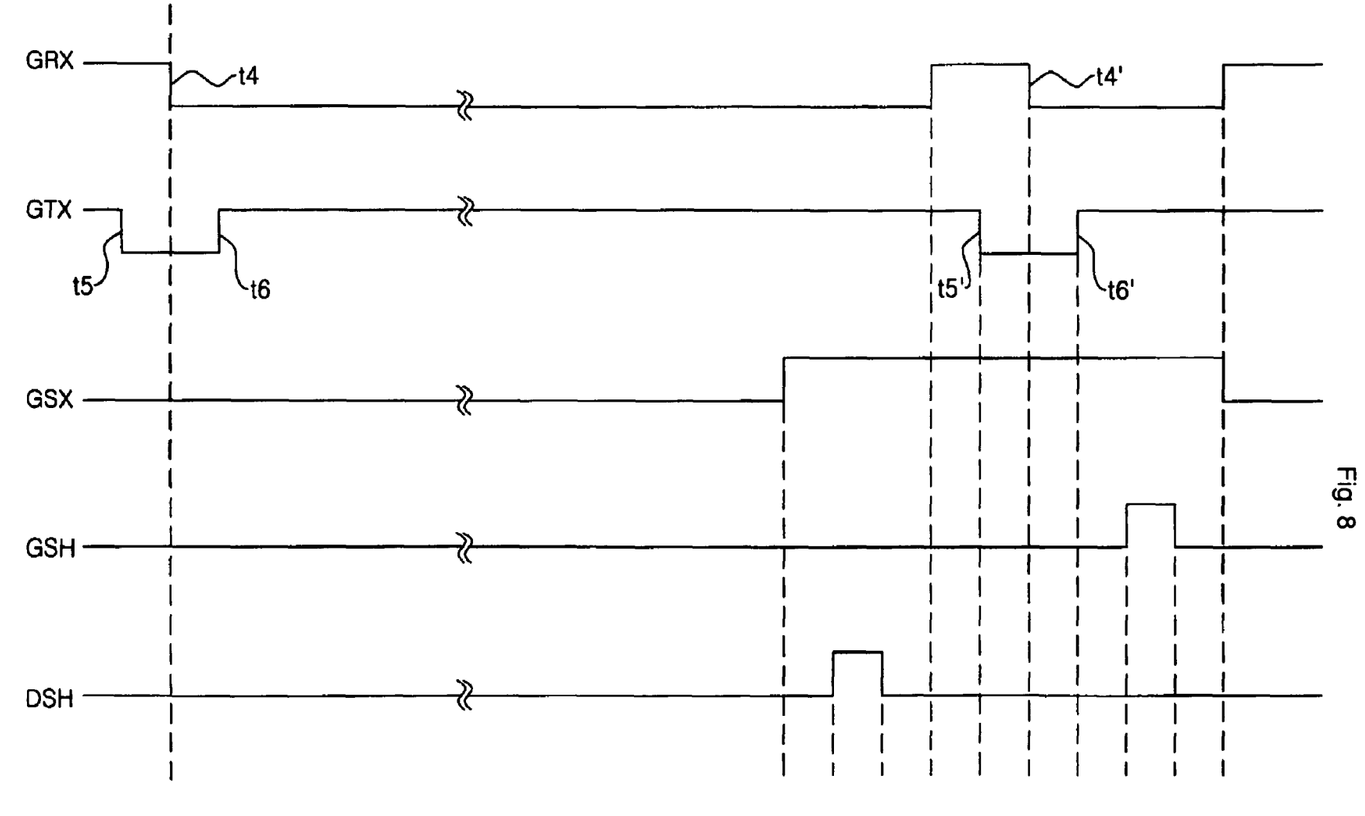
FIG. 8 is a timing diagram of signals related to the CMOS active pixel of FIG. 7.
Figure 9:
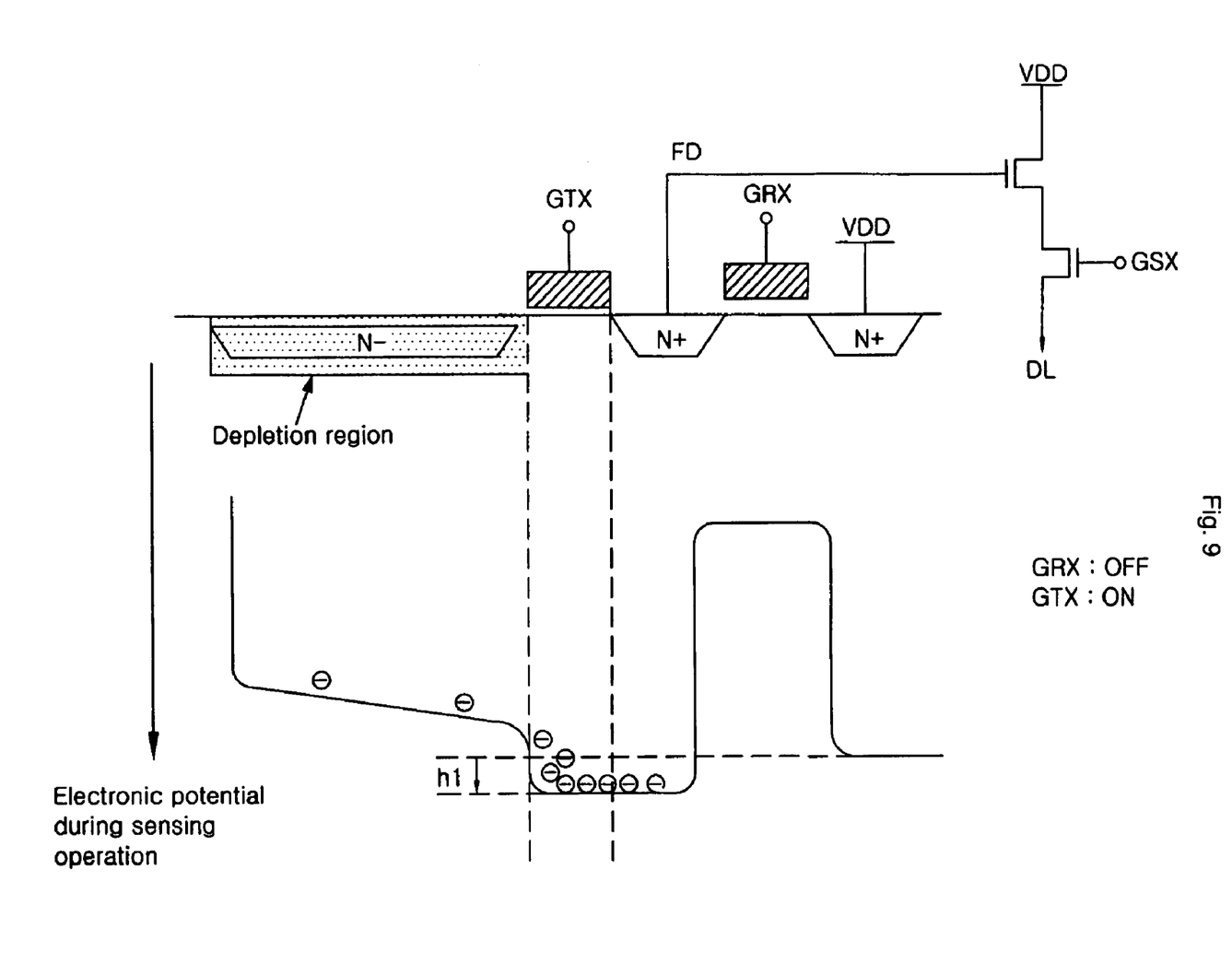
FIG. 9 is a view illustrating the section of the CMOS active pixel shown in FIG. 7, in which the section of a photodiode and electronic potentials with respect to the respective regions are shown with electronic signs of other elements.

FIG. 8 is a timing diagram of signals related to the CMOS active pixel of FIG. 7. As shown in FIG. 8, the transmission control signal GTX is around points t4 and t4 ? where the reset control signal GRX is inactivated. That is, the transmission control signal GTX is inactivated at points t5 and t5 ? before the reset control signal GRX is inactivated and activated at points t6 and t6 ? after the inactivation of the reset control signal GRX. According to the operation timing of the transmission control signal GTX, a charge pumping phenomenon occurs in the floating diffusion mode FD by a capacitor formed by the transmission transistor T11. As a result, as shown in FIG. 9, the electronic potential of the floating diffusion node FD may have a higher potential by h2 than the conventional technology.

Since the effect in accordance with the increase in the electronic potential of the floating diffusion node FD is almost the same as that described with reference to FIG. 5, a description thereof is omitted herein.

While this invention has been particularly shown and described with reference to preferred embodiments thereof, it will be understood by those skilled in the art that various changes in form and details may be made therein without departing from the spirit and scope of the invention as defined by the appended claims.

The invention claimed is:

1. A CMOS active pixel comprising:
a photodiode which generates signal charges according to received photons;
a capacitance node which receives the signal charges generated from the photodiode;
a reset transistor which resets the capacitance node in response to a reset control signal, wherein the reset control signal is continuously activated for a first predetermined time period during which the reset transistor is activated to form an initialization state on which electronic potential energy in area of the photodiode becomes a ground state;
a floating diffusion node which gates a driving transistor, the driving transistor being controlled by a voltage level of the floating diffusion node;
a select transistor which transmits a voltage transmitted by the driving transistor to a corresponding data line in response to a row selection signal; and
a capacitor transistor which has first and second source/drain ports connected to the capacitance node and the floating diffusion node, respectively, and is gated in response to a capacitor control signal, the capacitor transistor being activated in response to the capacitor control signal to form a capacitance;
wherein the capacitor control signal becomes in an inactivation state during the first predetermined time period so that the capacitor transistor is activated to form the capacitance during a second predetermined time period between a start time of the first predetermined time period and a start time of the inactivation state of the capacitor control signal; and
wherein electronic potentials in regions of the capacitor transistor and the floating diffusion node are higher than electronic potential in region of the photodiode in the initialization state, and a depletion region in the region of the photodiode does not increase.

2. The CMOS active pixel of claim 1, wherein the photodiode has a P-I-N (P-type semiconductor-intrinsic semiconductor-N-type semiconductor) structure.

3. A CMOS active pixel comprising:
a photodiode which generates signal charges according to received photons;
a capacitance node which receives the signal charges generated from the photodiode;
a reset transistor which resets the capacitance node in response to a reset control signal, wherein the reset control signal is continuously activated for a first predetermined time period during which the reset transistor is activated to form an initialization state in which electronic potential energy in area of the photodiode becomes a ground state;
a floating diffusion node which gates a driving transistor, the driving transistor being controlled by a voltage level of the floating diffusion node;
a select transistor which transmits a voltage transmitted by the driving transistor to a corresponding data line in response to a row selection signal; and
a capacitor which has one port commonly connected to the capacitance node and the floating diffusion node and the other port electrically connected to a capacitor control signal, the capacitor being activated in response to the capacitor control signal to form a capacitance;
wherein the capacitor control signal becomes in an inactivation state during the first predetermined time period so that the capacitor is activated to form the capacitance during a second predetermined time period between a start time of the first predetermined time period and a start time of the inactivation state of the capacitor control signal; and
wherein electronic potentials in regions of the capacitor and the floating diffusion node are higher than electronic potential in region of the photodiode in the initialization state, and a depletion region in the region of the photodiode does not increase.

4. A CMOS active pixel comprising:
a photodiode which generates signal charges according to received photons;
a transmission transistor which is connected between the photodiode and a capacitance node to provide the signal charges to the capacitance node in response to activation of a transmission control signal;

the capacitance node which receives the signal charges transmitted by the transmission transistor;

a reset transistor which resets the capacitance node in response to a reset control signal, wherein the reset control signal is continuously activated for a first predetermined time period during which the reset transistor is activated to form an initialization state in which electronic potential energy in area of the photodiode becomes a ground state;

a floating diffusion node which gates a driving transistor and electrically connected to the capacitance node;

the driving transistor which is controlled by a voltage level of the floating diffusion node; and a select transistor which transmits a voltage transmitted by the driving transistor to a corresponding data line in response to a row selection signal, wherein the transmission control signal becomes in an inactivation state during the first predetermined time period so that the transmission transistor is activated to provide the signal charges during a second predetermined time period between a start time of the first predetermined time period and a start time of the inactivation state of the transmission control signal; and wherein electronic potentials in regions of the transmission transistor and the floating diffusion node are higher than electronic potential in region of the photodiode in the initialization state, and a depletion region in the region of the photodiode does not increase.

* * * * *